United States Patent
Zhang et al.

(10) Patent No.: US 10,224,252 B2
(45) Date of Patent: Mar. 5, 2019

(54) METHOD FOR FABRICATING ARRAY SUBSTRATE, ARRAY SUBSTRATE AND DISPLAY DEVICE

(71) Applicant: BOE TECHNOLOGY GROUP CO., LTD., Beijing (CN)

(72) Inventors: Bin Zhang, Beijing (CN); Chienhung Liu, Beijing (CN); Yucheng Chan, Beijing (CN); Xuefei Sun, Beijing (CN); Zhanfeng Cao, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/736,972

(22) PCT Filed: Jun. 14, 2017

(86) PCT No.: PCT/CN2017/088200
§ 371 (c)(1),
(2) Date: Dec. 15, 2017

(87) PCT Pub. No.: WO2018/028298
PCT Pub. Date: Feb. 15, 2018

(65) Prior Publication Data
US 2018/0374762 A1 Dec. 27, 2018

(30) Foreign Application Priority Data
Aug. 10, 2016 (CN) .......................... 2016 1 0649679

(51) Int. Cl.
*H01L 21/84* (2006.01)
*H01L 27/146* (2006.01)
*H01L 27/12* (2006.01)

(52) U.S. Cl.
CPC .......... *H01L 21/84* (2013.01); *H01L 27/1218* (2013.01); *H01L 27/1222* (2013.01); *H01L 27/14623* (2013.01)

(58) Field of Classification Search
None
See application file for complete search history.

(56) References Cited

U.S. PATENT DOCUMENTS

| 2013/0038641 A1 | 2/2013 | Muneyoshi |
| 2015/0214254 A1 | 7/2015 | Yan et al. |

(Continued)

FOREIGN PATENT DOCUMENTS

| CN | 202025170 U | 11/2011 |
| CN | 103367165 A | 10/2013 |

(Continued)

OTHER PUBLICATIONS

Search Report for International Application No. PCT/CN088200 dated Sep. 20, 2017.

(Continued)

*Primary Examiner* — Michelle Mandala
(74) *Attorney, Agent, or Firm* — Calfee, Halter & Griswold LLP

(57) ABSTRACT

A method for fabricating an array substrate, an array substrate, and a display device are disclosed. The method includes forming a whole layer of opaque film on a substrate; treating the film to form a transparent region and an opaque region in the film, wherein the opaque region corresponds with a channel region of an active layer; and forming a thin film transistor on the film which has been treated. In the method, prior to forming the thin film transistor, the whole layer of opaque film is formed to comprise the transparent region and the opaque region. When other films are deposited on the whole layer of film, no difference (Continued)

in height occurs, and this further avoids various defects due to difference in height.

20 Claims, 3 Drawing Sheets

(56) References Cited

U.S. PATENT DOCUMENTS

2015/0303225 A1\* 10/2015 Jiang .................. H01L 27/1288
　　　　　　　　　　　　　　　　　　　　　　　　257/72
2015/0340504 A1\* 11/2015 Choi ................ H01L 29/41733
　　　　　　　　　　　　　　　　　　　　　　　　257/43
2016/0064421 A1　　 3/2016 Oh et al.

FOREIGN PATENT DOCUMENTS

| CN | 103579356 A | 2/2014 |
| CN | 103592801 A | 2/2014 |
| CN | 105390504 A | 3/2016 |
| CN | 106206456 A | 12/2016 |

OTHER PUBLICATIONS

Second Office Action for Chinese Patent Application No. 201610649679.6 dated Jan. 3, 2019.

\* cited by examiner

METHOD FOR FABRICATING ARRAY SUBSTRATE, ARRAY SUBSTRATE AND DISPLAY DEVICE

RELATED APPLICATIONS

The present application is the U.S. national phase entry of PCT/CN2017/088200, with an international filing date of Jun. 14, 2017, which claims the benefit of Chinese Patent Application No. 201610649679.6, filed on Aug. 10, 2016, the entire disclosures of which are incorporated herein by reference.

TECHNICAL FIELD

The present disclosure relates to the field of display technology, and method for fabricating an array substrate, array substrate and display device.

BACKGROUND

Currently, LTPS (Low Temperature Poly-Silicon) technique has become popular in the industry of middle or small size display. In LTPS technique, polycrystalline silicon is very sensitive to back light, and thus a light shielding layer is arranged at the bottom to solve this problem. Usually, a metal is used as the light shielding layer in LTPS or other TFTs of a top gate structure. However, during forming a pattern of the light shielding layer, the redundant light shielding metal is generally etched away by an etching process, a buffer layer of a certain thickness is deposited on the light shielding layer, and then amorphous silicon is deposited and converted into polycrystalline silicon. Since the deposited buffer layer forms a raised portion in at the position of the light shielding layer, this causes difference in height. As a result, during the excimer laser annealing process for the active layer, crystallization performance of polycrystalline silicon degrades, and this causes crystallization defects. The thickness of buffer layer is generally increased to decrease the difference in height of the buffer layer. However, a buffer layer with a large thickness leads to stress mismatch between the buffer layer and a glass substrate, and this causes various defects like glass bending or film falling off.

SUMMARY

Embodiments of the present disclosure provide a method for fabricating an array substrate, an array substrate, and a display device.

In an embodiment of the present disclosures a method for fabricating an array substrate, comprising:
  forming a whole layer of opaque film on a substrate;
  treating the film to form a transparent region and an opaque region in the film, wherein the opaque region corresponds with a channel region of an active layer; and
  forming a thin film transistor on the film which has been treated.

In the method for fabricating the array substrate of this embodiment, prior to forming the thin film transistor, the whole layer of opaque film is formed to comprise the transparent region and the opaque region. When other films are subsequently deposited on the whole layer of film, no difference in height occurs, and this further avoids various defects due to difference in height.

In an exemplary embodiment, the step of treating the film to form the transparent region and the opaque region in the film comprises:
  applying photoresist on the film;
  performing exposure and development on the photoresist with a mask plate, and retaining the photoresist corresponding with an opaque region to be formed of the film;
  oxidizing the film in a transparent region to be formed with an oxidant, by using the retained photoresist as a mask, so that the film in the transparent region to be formed is formed to be transparent; and
  peeling off the retained photoresist to obtain the transparent region and the opaque region in the film.

In an exemplary embodiment, the oxidant is hydrogen peroxide.

In an exemplary embodiment, an orthogonal projection of the channel region of the active layer on the substrate falls within an orthogonal projection of the opaque region on the substrate.

In an exemplary embodiment, the whole layer of opaque film comprises tantalum.

In an exemplary embodiment, the step of forming the thin film transistor on the film which has been treated comprises:
  depositing an amorphous silicon layer on the film which has been treated, and annealing the amorphous silicon layer with an excimer laser, so that the amorphous silicon layer is crystallized into a polycrystalline silicon layer; and
  forming a pattern of the active layer by performing a patterning process on the polycrystalline silicon layer for one time.

In an embodiment of the present disclosures an array substrate, comprising: a substrate, a whole layer of film which is arranged on the substrate, and a thin film transistor, wherein the film comprises a transparent region and an opaque region, and the opaque region corresponds with a channel region of an active layer.

In an exemplary embodiment, an orthogonal projection of the channel region of the active layer on the substrate falls within an orthogonal projection of the opaque region on the substrate.

In an exemplary embodiment, the film in the transparent region is an oxidized film.

In an exemplary embodiment, the opaque region comprises tantalum, and the transparent region comprises tantalum oxide.

In an exemplary embodiment, the thin film transistor is of a top gate type.

In an exemplary embodiment, the array substrate further comprises a buffer layer which is arranged between the film and the thin film transistor, and the buffer layer has a thickness of 1000 angstrom-5000 angstrom.

In an embodiment of the present disclosures a display device, comprising the array substrate as mentioned above.

DETAILED DESCRIPTION OF EMBODIMENTS

The accompanying drawings are provided for further understanding of embodiments and the accompanying drawings are incorporated to constitute a part of the present disclosure. The accompanying drawings illustrate embodiments and explain the principles of the present disclosure together with the brief description. It could be easily realized that other embodiments and many desired advantages of embodiments, which could become easy to be understood by reference of description in details below.

The elements in the accompanying drawing are not necessarily to scale.

In the method for fabricating an array substrate according to an embodiment of the present disclosure, a process for forming a light shielding layer is redesigned and optimized on basis of the existing method for fabricating an array substrate, and the structure of the existing light shielding layer is changed. The method will be described in detail hereinafter.

Figure 1:
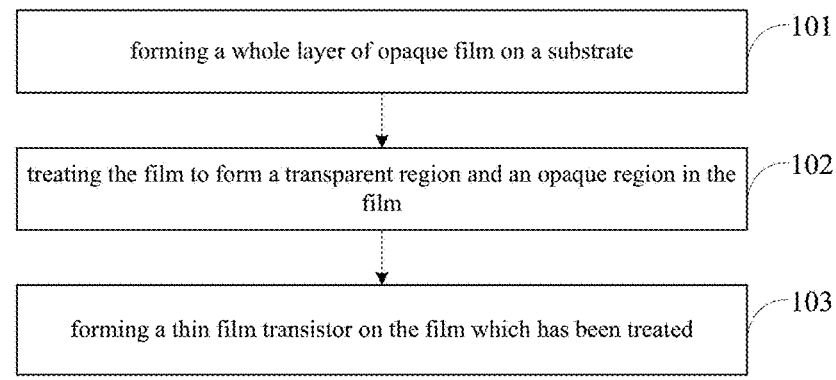
FIG. 1 is a flow chart for illustrating a method for fabricating an array substrate in an embodiment of the present disclosure.

An embodiment of the present disclosure provides a method for fabricating an array substrate. As shown in FIG. 1, the method comprises steps of:

step 101, forming a whole layer of opaque film on a substrate;

step 102, treating the film to form a transparent region and an opaque region in the film, wherein the opaque region corresponds with a channel region of an active layer; and step 103, forming a thin film transistor on the film which has been treated.

In the above method for fabricating the array substrate, the whole layer of light shielding film is formed on the substrate. This can avoid difference in height in case other films are formed on the light shielding film, and reduce defects due to difference in height.

Generally when a light shielding layer is formed a common LTPS process or other top gate structure, deposition of a buffer layer will introduce difference in height, which affects crystallization performance of polycrystalline silicon. A method for decreasing difference in height is to increase a thickness of the buffer layer. However, this method can not effectively improve the problem crystallization defect, and can even cause various other defects.

Based on this, in a method for fabricating an array substrate according to an embodiment, prior to forming the buffer layer, a whole layer of opaque film is formed, and the film is treated to form a transparent region and an opaque region. In this way, when the buffer layer is deposited on the whole layer of film, the buffer layer will not be subject to difference in height. Furthermore, during subsequent excimer laser annealing process, the crystallization performance of polycrystalline silicon will not be affected. Meanwhile, in the method of the present disclosure, the effect of difference in height on crystallization performance can be efficiently eliminated, without increasing the thickness of the buffer layer. This further avoids various other defects due to a too thick buffer layer.

Figure 2A:
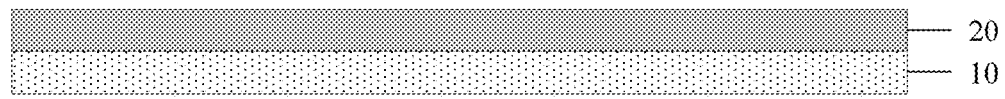
FIG. 2a, FIG. 2b and FIG. 2c are structural views for illustrating steps in a method for fabricating an array substrate in an embodiment of the present disclosure.

In implementations, in step 101, as shown in FIG. 2a, a whole layer of opaque film 20 is formed on a substrate 10. The opaque film 20 is used for forming a light shielding film in the array substrate. The whole layer of opaque film 20 is required to be oxidized into transparent film. In an example, the whole layer of opaque film comprises metal tantalum.

Figure 2B:
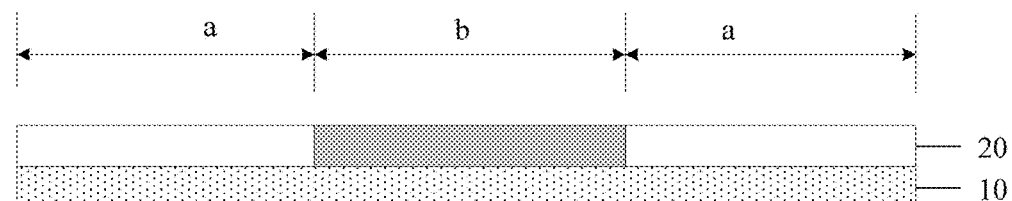

In implementations, in step 102, as shown in FIG. 2b, the whole layer of film 20 as formed above is treated, so that a transparent region a and an opaque region b are formed in the film. The opaque region b corresponds with a channel region of an active layer. In other words, two regions a of the film 20 in the figure is converted into a transparent region, while the opaque region b which corresponds with the channel region of the active layer is not subject to the treatment and is still opaque.

Figure 2C:
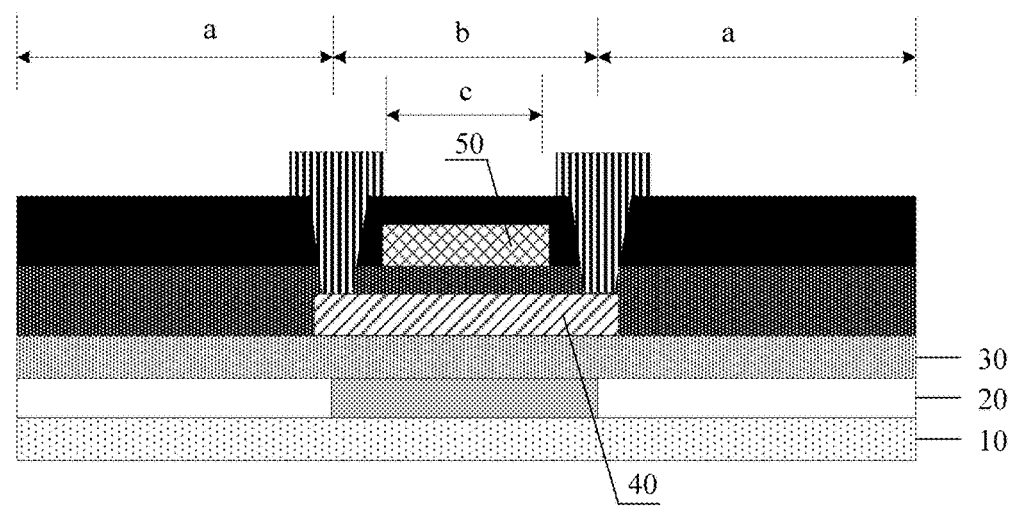

In implementations, after steps 101 and 102, step 103 is performed, i.e., forming a thin film transistor on the film which has been treated. As shown in FIG. 2c, the thin film transistor is arranged above the film 20. A gate 50 of the thin film transistor is located above an active layer 40, and thus the thin film transistor is of top gate type.

In implementations, during forming the thin film transistor on the film which has been treated, a buffer layer 30 is deposited on the film which has been treated, and the thin film transistor is formed on the buffer layer 30. In an exemplary embodiment, step 103 may further comprise a step of forming an active layer on the buffer layer. The active layer can be formed in the following manner.

Figure 2D:
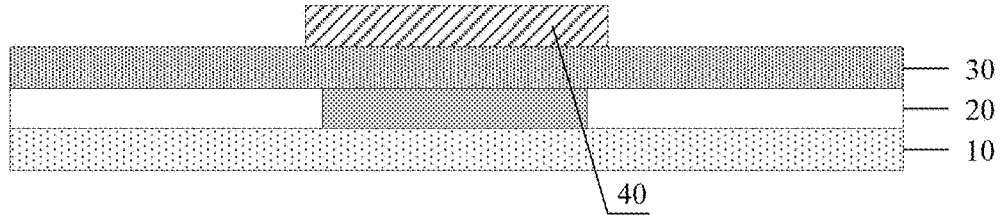
FIG. 2d is a structural view for illustrating formation a pattern of active layer in an embodiment of the present disclosure.

Firstly, a whole layer of amorphous silicon layer is deposited on the film which has been treated 20. The buffer layer is deposited on the film which has been treated 20, and then the active layer is formed. Therefore, the whole layer of amorphous silicon layer is firstly deposited on the buffer layer 30, and the amorphous silicon layer is subject to excimer laser annealing, so that the amorphous silicon layer is crystallized into a polycrystalline silicon layer. Then, a pattern of the active layer is formed on the polycrystalline silicon layer by performing a patterning process for one time. This is shown in FIG. 2d, which is a structural view after the pattern of active layer has been formed.

Figure 3:
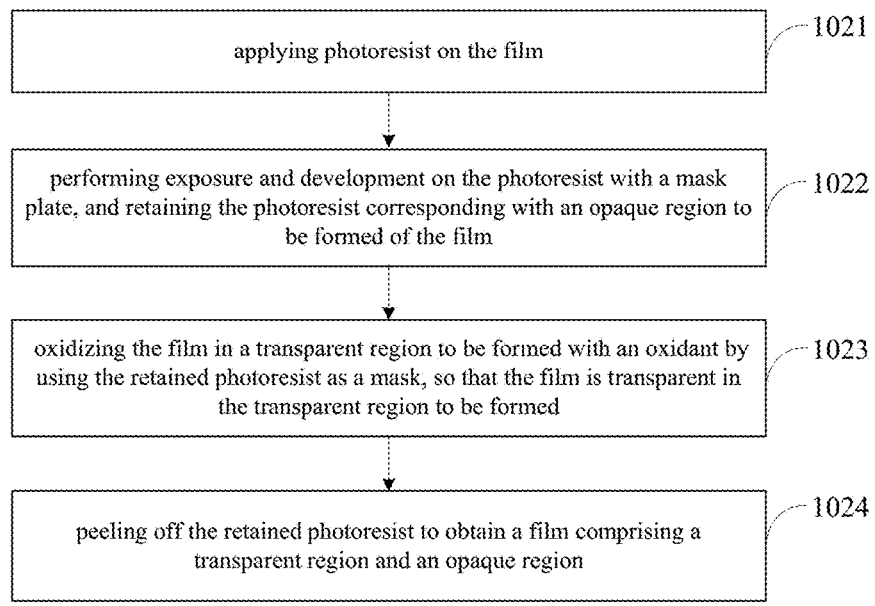
FIG. 3 is a flow chart for illustrating a method for treating a whole layer of opaque film in an embodiment of the present disclosure.

Reference is made to FIG. 3, which is a flow chart for a method of treating the whole layer of opaque film. In particular, in an embodiment of the present disclosure, for example, treating the film in step 102 can be realized by the following steps:

step 1021, applying photoresist on the film;

step 1022, performing exposure and development on the photoresist with a mask plate, and retaining the photoresist corresponding with an opaque region to be formed of the film;

step 1023, oxidizing the film in a transparent region to be formed with an oxidant by using the retained photoresist as a mask, so that the film is transparent in the transparent region to be formed; and step 1024, peeling off the retained photoresist to obtain a film comprising a transparent region and an opaque region.

Figure 4A:
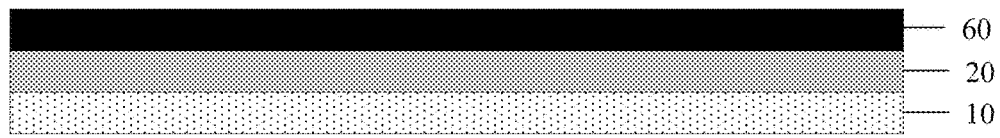
FIG. 4a, FIG. 4b are FIG. 4c are structural views for illustrating steps in a method for treating a whole layer of opaque film in an embodiment of the present disclosure.

In implementations, as shown in FIG. 4a, a whole layer of photoresist 60 is firstly applied on a whole layer of opaque film 20.

Figure 4B:
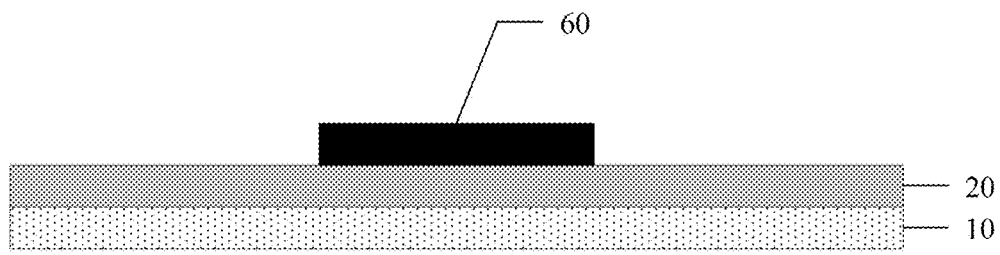

Secondly, as shown in FIG. 4b, exposure and development are performed on the whole layer of photoresist 60 with a mask plate, and the photoresist 60 corresponding with the opaque region to be formed of the film is retained. The retained photoresist 60 corresponds with a channel region of an active layer.

Figure 4C:
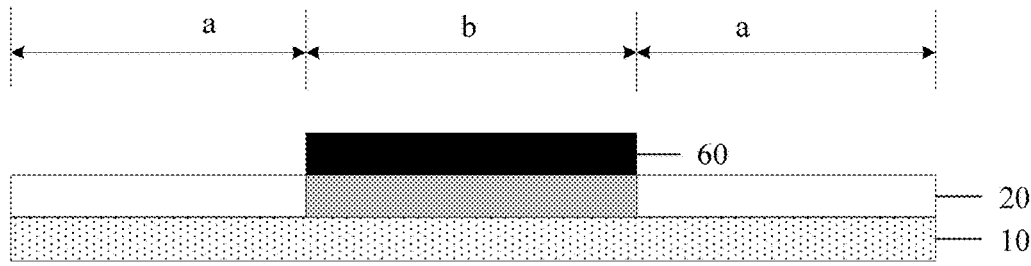

Then, as shown in FIG. 4c, the retained photoresist 60 in FIG. 4b is again used as a mask, the opaque portion of film 20 is oxidized with an oxidant, so that the transparent region to be formed of the film (i.e., two regions a) becomes transparent. In an exemplary embodiment, the above oxidant is hydrogen peroxide.

Finally, after oxidation, the retained photoresist 60 is peeled off, and a whole layer of oxidized film is formed, as shown in FIG. 2b. The region b of the film which corresponds with the channel region of the active layer is opaque, while other regions a are transparent.

In implementations, in order to prevent light leakage in the opaque region, as shown in FIG. 2c, for example, an orthogonal projection of the channel region c of the active layer on the substrate 10 falls within an orthogonal projection of the opaque region b on the substrate 10. In particular, an area of the opaque region b in the film is larger than an area of the channel region c of the active layer, i.e., the opaque region b can at least completely cover the channel region c of the active layer. This prevents the problem in which the polycrystalline silicon material in the active layer degrades by light irradiation due to light leakage a region surrounding the opaque region.

Figure 5:
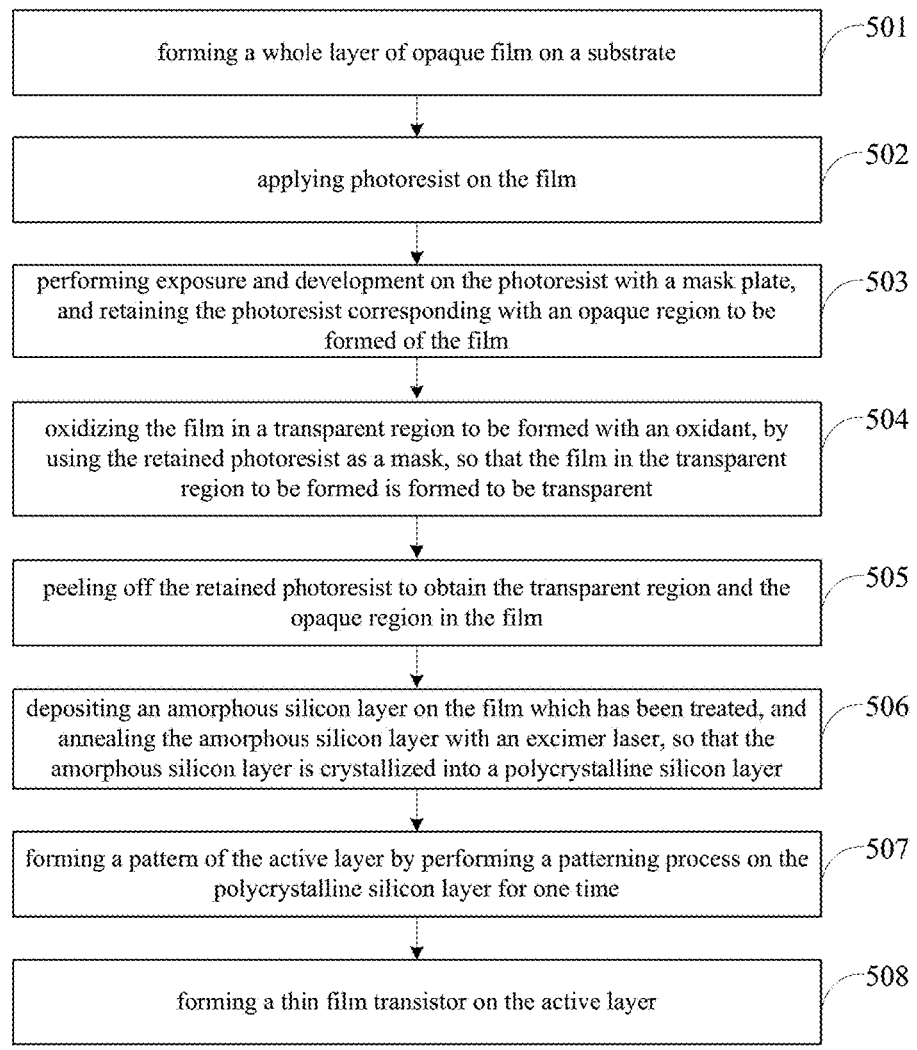
FIG. 5 is a flow chart for illustrating a method for fabricating the array substrate in an embodiment of the present disclosure.

As shown in FIG. 5, in an embodiment of the present disclosure, the above method for fabricating an array substrate comprises steps of:

step 501, forming a whole layer of opaque film on a substrate;

step 502, applying photoresist on the film;

step 503, performing exposure and development on the photoresist with a mask plate, and retaining the photoresist corresponding with an opaque region to be formed of the film;

step 504, oxidizing the film in a transparent region to be formed with an oxidant, by using the retained photoresist as a mask, so that the film in the transparent region to be formed is formed to be transparent;

step 505, peeling off the retained photoresist to obtain the transparent region and the opaque region in the film;

step 506, depositing an amorphous silicon layer on the film which has been treated, and annealing the amorphous silicon layer with an excimer laser, so that the amorphous silicon layer is crystallized into a polycrystalline silicon layer;

step 507, forming a pattern of the active layer by performing a patterning process on the polycrystalline silicon layer for one time; and step 508, forming a gate, a source, and a drain of the thin film transistor on the active layer.

On basis of the same inventive concept, an embodiment of the present disclosure provides an array substrate. As shown in FIG. 2c, the array substrate comprises: the substrate 10, the whole layer of film 20 which is arranged on the substrate 10, and a thin film transistor. The film comprises the transparent region a and the opaque region b. The opaque region b corresponds with the channel region c of the active layer of the thin film transistor.

In the array substrate according an embodiment of the present disclosure, the light shielding layer is a film which has a whole layer structure and comprises a transparent region and an opaque region. The buffer layer is arranged on the whole layer of film, and thus no difference in height occurs. During a subsequent process of annealing polycrystalline silicon with excimer laser, the effect of difference in height on crystallization can be efficiently reduced. Besides, since there is no difference in height, the thickness of buffer layer can be adjusted as desired. This can appropriately decrease the thickness of buffer layer, and eliminate adverse effects resulting from stress. In an exemplary embodiment, the array substrate further comprises a buffer layer which is arranged between the film and the thin film transistor, and the buffer layer has a thickness of 1000 angstrom-5000 angstrom.

For purpose of not affecting the display effect, apart from the region b which corresponds with the channel region c of the active layer, other regions a of the film are required to be transparent. In an exemplary embodiment, the film in the transparent region (i.e., regions a) is an oxidized film. In implementations, the opaque film can be converted into a transparent oxide film by oxidation.

The metal tantalum is resistant to high temperature, and can be converted to be transparent. In implementations, the above opaque film can be made from the metal tantalum. In an exemplary embodiment, the opaque region comprises tantalum, and the transparent region comprises tantalum oxide. In an exemplary embodiment, the metal tantalum can be oxidized by hydrogen peroxide into a colorless and transparent tantalum oxide (e.g., tantalum trioxide or tantalum pentoxide).

According to an embodiment of the present disclosure, in order to avoid difference in height in the buffer layer, a film which has a whole layer structure and comprises a transparent region and an opaque region is arranged in the array substrate. In fact, it is also possible for the film to have an in-whole layer structure. In an exemplary embodiment, a film which at least covers the active layer and comprises a transparent region and an opaque region can be used as the light shielding film. It is only required that after the polycrystalline silicon is subsequently formed by annealing with excimer laser, the difference in height will not affect crystallization effect.

In an exemplary embodiment, a pattern of film is formed by using a half tone mask plate, and the film is oxidized by means of a photoresist. In this way, a light shielding film which at least covers the active layer and has a transparent region and an opaque region can be formed without increasing the number of mask plates.

In the above embodiments of the present disclosure, the array substrate is described with reference to a structure in which a light shielding layer is needed, and for example, the thin film transistor is of a top gate type. Since the present disclosure mainly focuses on improvement in the metal of light shielding layer, it is required to be arranged in a thin film transistor with a light shielding layer, such as a thin film transistor of a top gate type structure, or a LTPS thin film transistor.

On basis of the same concept, an embodiment of the present disclosure further provides a display device, comprising the array substrate in the above embodiments. The display device can be any product or component with a display function like a mobile phone, tablet computer, TV, monitor, notebook computer, digital photo frame, navigator, electronic paper, or the like. As for the embodiments of the display device, reference can be made for those of the array substrate.

To sum up, in the method for fabricating an array substrate according to embodiments of the present disclosure, prior to forming the thin film transistor, the whole layer of opaque film is formed to comprise the transparent region and the opaque region. When the buffer layer is deposited on the whole layer of film, no difference in height occurs. Furthermore, during subsequent excimer laser annealing process, the crystallization performance of polycrystalline silicon will not be affected. Meanwhile, in the method of the present disclosure, the effect of difference in height on crystallization performance can be efficiently eliminated, without increasing the thickness of the buffer layer. This further avoids various other defects due to a too thick buffer layer.

Apparently, the person with ordinary skill in the art can make various modifications and variations to the present disclosure without departing from the spirit and the scope of the present disclosure. In this way, provided that these modifications and variations of the present disclosure belong to the scopes of the claims of the present disclosure and the equivalent technologies thereof, the present disclosure also intends to encompass these modifications and variations.

What is claimed is:

1. A method for fabricating an array substrate, comprising:
   forming a whole layer of opaque film on a substrate;
   treating the film to form a transparent region and an opaque region in the film, wherein the opaque region corresponds with a channel region of an active layer; and
   forming a thin film transistor on the film which has been treated.

2. The method of claim 1, wherein the step of treating the film to form the transparent region and the opaque region in the film comprises:
   applying photoresist on the film;
   performing exposure and development on the photoresist with a mask plate, and retaining the photoresist corresponding with an opaque region to be formed of the film;
   oxidizing the film in a transparent region to be formed with an oxidant, by using the retained photoresist as a mask, so that the film in the transparent region to be formed is formed to be transparent; and
   peeling off the retained photoresist to obtain the transparent region and the opaque region in the film.

3. The method of claim 2, wherein the oxidant is hydrogen peroxide.

4. The method of claim 1, wherein an orthogonal projection of the channel region of the active layer on the substrate falls within an orthogonal projection of the opaque region on the substrate.

5. The method of claim 1, wherein the whole layer of opaque film comprises tantalum.

6. The method of claim 1, wherein the step of forming the thin film transistor on the film which has been treated comprises:
   depositing an amorphous silicon layer on the film which has been treated, and annealing the amorphous silicon layer with an excimer laser, so that the amorphous silicon layer is crystallized into a polycrystalline silicon layer; and
   forming a pattern of the active layer by performing a patterning process on the polycrystalline silicon layer for one time.

7. An array substrate, comprising: a substrate, a whole layer of film which is arranged on the substrate, and a thin film transistor,
   wherein the film comprises a transparent region and an opaque region, and the opaque region corresponds with a channel region of an active layer.

8. The array substrate of claim 7, wherein an orthogonal projection of the channel region of the active layer on the substrate falls within an orthogonal projection of the opaque region on the substrate.

9. The array substrate of claim 7, wherein the film in the transparent region is an oxidized film.

10. The array substrate of claim 9, wherein the opaque region comprises tantalum, and the transparent region comprises tantalum oxide.

11. The array substrate of claim 8, wherein the thin film transistor is of a top gate type.

12. The array substrate of claim 7, further comprising: a buffer layer which is arranged between the film and the thin film transistor, wherein the buffer layer has a thickness of 1000 angstrom-5000 angstrom.

13. A display device, comprising the array substrate of claim 7.

14. The method of claim 2, wherein the step of forming the thin film transistor on the film which has been treated comprises:
   depositing an amorphous silicon layer on the film which has been treated, and annealing the amorphous silicon layer with an excimer laser, so that the amorphous silicon layer is crystallized into a polycrystalline silicon layer; and
   forming a pattern of the active layer by performing a patterning process on the polycrystalline silicon layer for one time.

15. The method of claim 3, wherein the step of forming the thin film transistor on the film which has been treated comprises:
   depositing an amorphous silicon layer on the film which has been treated, and annealing the amorphous silicon layer with an excimer laser, so that the amorphous silicon layer is crystallized into a polycrystalline silicon layer; and
   forming a pattern of the active layer by performing a patterning process on the polycrystalline silicon layer for one time.

16. The method of claim 4, wherein the step of forming the thin film transistor on the film which has been treated comprises:
   depositing an amorphous silicon layer on the film which has been treated, and annealing the amorphous silicon layer with an excimer laser, so that the amorphous silicon layer is crystallized into a polycrystalline silicon layer; and
   forming a pattern of the active layer by performing a patterning process on the polycrystalline silicon layer for one time.

17. The method of claim 5, wherein the step of forming the thin film transistor on the film which has been treated comprises:
   depositing an amorphous silicon layer on the film which has been treated, and annealing the amorphous silicon layer with an excimer laser, so that the amorphous silicon layer is crystallized into a polycrystalline silicon layer; and
   forming a pattern of the active layer by performing a patterning process on the polycrystalline silicon layer for one time.

18. The array substrate of claim 8, further comprising: a buffer layer which is arranged between the film and the thin film transistor, wherein the buffer layer has a thickness of 1000 angstrom-5000 angstrom.

19. The array substrate of claim 9, further comprising: a buffer layer which is arranged between the film and the thin film transistor, wherein the buffer layer has a thickness of 1000 angstrom-5000 angstrom.

20. The array substrate of claim 10, further comprising: a buffer layer which is arranged between the film and the thin film transistor, wherein the buffer layer has a thickness of 1000 angstrom-5000 angstrom.

* * * * *